(12) United States Patent
Mossavat et al.

(10) Patent No.: US 10,156,797 B2
(45) Date of Patent: Dec. 18, 2018

(54) METHOD OF DETERMINING EDGE PLACEMENT ERROR, INSPECTION APPARATUS, PATTERNING DEVICE, SUBSTRATE AND DEVICE MANUFACTURING METHOD

(71) Applicant: ASML Netherlands B.V., Veldhoven (NL)

(72) Inventors: Seyed Iman Mossavat, Eindhoven (NL); Hugo Augustinus Joseph Cramer, Eindhoven (NL); Maurits Van Der Schaar, Eindhoven (NL)

(73) Assignee: ASML Netherlands, B.V., Veldhoven (NL)

( * ) Notice: Subject to any disclaimer, the term of this patent is extended or adjusted under 35 U.S.C. 154(b) by 0 days.

(21) Appl. No.: 15/114,368

(22) PCT Filed: Jan. 22, 2015

(86) PCT No.: PCT/EP2015/051262
§ 371 (c)(1),
(2) Date: Jul. 26, 2016

(87) PCT Pub. No.: WO2015/121045
PCT Pub. Date: Aug. 20, 2015

(65) Prior Publication Data
US 2017/0010541 A1 Jan. 12, 2017

(30) Foreign Application Priority Data
Feb. 17, 2014 (EP) .................. 14155377
Apr. 2, 2014 (EP) .................. 14163183

(51) Int. Cl.
*G03F 7/20* (2006.01)
*G01B 11/27* (2006.01)

(52) U.S. Cl.
CPC ........ *G03F 7/70591* (2013.01); *G01B 11/272* (2013.01); *G03F 7/70625* (2013.01); *G03F 7/70633* (2013.01); *G03F 7/70683* (2013.01)

(58) Field of Classification Search
CPC ............. G01B 11/272; G03F 7/70591; G03F 7/70625; G03F 7/70633; G03F 7/70683
(Continued)

(56) References Cited

U.S. PATENT DOCUMENTS

| | | | |
|---|---|---|---|
| 7,349,752 B1 | 3/2008 | Sturtevant et al. | |
| 7,427,774 B1 * | 9/2008 | Mantz ................. | G03F 9/7076 257/48 |

(Continued)

FOREIGN PATENT DOCUMENTS

| | | |
|---|---|---|
| CN | 102799075 | 11/2012 |
| CN | 103376643 | 10/2013 |

(Continued)

OTHER PUBLICATIONS

Chinese Office Action dated Mar. 3, 2017 in corresponding Chinese Patent Application No. 201580008855.1.
(Continued)

*Primary Examiner* — Colin Kreutzer
(74) *Attorney, Agent, or Firm* — Pillsbury Winthrop Shaw Pittman LLP

(57) ABSTRACT

A method of determining edge placement error within a structure produced using a lithographic process, the method including: receiving a substrate having a first structure produced using the lithographic process, the first structure having first and second layers, each of the layers having first areas of electrically conducting material and second areas of non-electrically conducting material; receiving a target signal indicative of a first target relative position which is indicative of target position of edges between the first areas
(Continued)

and the second areas of the first layer relative to edges between the first areas and second areas of the second layer in the first structure during the lithographic process; detecting scattered radiation while illuminating the first structure with optical radiation to obtain a first signal; and ascertaining an edge placement error parameter on the basis of first signal and the first target relative position.

21 Claims, 10 Drawing Sheets

(58) Field of Classification Search
USPC .................. 355/67, 68, 77; 356/399–401
See application file for complete search history.

(56) References Cited

U.S. PATENT DOCUMENTS

| | | | |
|---|---|---|---|
| 7,739,651 | B2 | 6/2010 | Melvin, III et al. |
| 7,865,864 | B2 | 1/2011 | Banerjee et al. |
| 8,399,157 | B2 | 3/2013 | Ogadhoh |
| 8,411,287 | B2 | 4/2013 | Smilde et al. |
| 8,856,694 | B2 | 10/2014 | Ye et al. |
| 9,081,303 | B2 | 7/2015 | Cramer et al. |
| 9,140,998 | B2 | 9/2015 | Smilde et al. |
| 2011/0027704 | A1 | 2/2011 | Cramer et al. |
| 2011/0028004 | A1 | 2/2011 | Wang et al. |
| 2011/0043791 | A1 | 2/2011 | Smilde et al. |
| 2011/0215442 | A1* | 9/2011 | Shneyder ............... B32B 38/00 257/621 |
| 2012/0123581 | A1 | 5/2012 | Smilde et al. |
| 2015/0234279 | A1* | 8/2015 | Fujiwara .................. G03F 7/20 438/763 |
| 2016/0123726 | A1* | 5/2016 | Yamaguchi ........... H01J 37/222 250/307 |

FOREIGN PATENT DOCUMENTS

| | | |
|---|---|---|
| EP | 1 628 164 | 2/2006 |
| KR | 10-0815958 | 3/2008 |
| KR | 10-2012-0044374 | 5/2012 |
| WO | 2009/078708 | 6/2009 |
| WO | 2009/106279 | 9/2009 |
| WO | 2013/101103 | 7/2013 |
| WO | 2014/016056 | 1/2014 |
| WO | 2014/082938 | 6/2014 |

OTHER PUBLICATIONS

International Search Report and Written Opinion dated May 19, 2015 in corresponding International Patent Application No. PCT/EP2015/051262.

Jos Maas et al., "YieldStar: a New Metrology Platform for Advanced Lithography Control," Proc. of SPIE, vol. 7985, pp. 79850H-1-79850H-10 (2011).

Henk-Jan H. Smilde et al., "Evaluation of a novel ultra small target technology supporting on-product overlay measurement," Proc. of SPIE, vol. 8324, pp. 83241A-1-83241A-8 (2012).

Hidetoshi Morokuma et al., "A new matching engine between design layout and SEM image of semiconductor device," Proc. of SPIE, vol. 5752, pp. 546-558 (2005).

Cyrus Tabery et al., "Use of Design Pattern Layout for Automated Metrology Recipe Generation," Proc. of SPIE, vol. 5752, pp. 1424-1434 (2005).

H.B. Chan et al., "Optical transmission through double-layer metallic subwavelength slit arrays," Optics Letters, vol. 31, No. 4, pp. 516-518 (Feb. 15, 2006).

Z. Marcet et al., "Controlling the phase delay of light transmitted through double-layer metallic subwavelength slit arrays," Optics Letters, vol. 33, No. 13, pp. 1410-1412 (Jul. 1, 2008).

Cyrus Tabery et al., "Evaluation of OPC Quality using Automated Edge Placement Error Measurement with CD-SEM," Proc. of SPIE, vol. 6152, pp. 61521F-1-61521F-10 (2006).

Martin Ebert et al., "Combined Overlay, Focus and CD Metrology for leading Edge Lithography," Proc. of SPIE, vol. 7973, pp. 797311-1-797311-14 (2011).

Korean Office Action issued in corresponding Korean Patent Application No. 10-2016-7025526, dated May 24, 2018.

* cited by examiner

METHOD OF DETERMINING EDGE PLACEMENT ERROR, INSPECTION APPARATUS, PATTERNING DEVICE, SUBSTRATE AND DEVICE MANUFACTURING METHOD

CROSS REFERENCE TO RELATED APPLICATIONS

This application is the U.S. national phase entry of PCT Patent Application No. PCT/EP2015/051262, which was filed on Jan. 22, 2015, which claims the benefit of priority of EP Patent Application Ser. No. 14155377, filed Feb. 17, 2014, and EP Patent Application Ser. No. 14163183, filed Apr. 2, 2014, each of which are incorporated by reference herein in its entirety.

BACKGROUND

Field of the Invention

The present invention relates to methods and apparatus for determining edge placement error of a process in the manufacture of devices using lithographic techniques and to methods of manufacturing devices using lithographic techniques. Edge placement error may arise in any of the individual steps in a process for the manufacture of a device. For example, edge placement error can happen as a result of any step in the (dual) damascene process which includes several steps.

Background Art

A lithographic apparatus is a machine in a process for applying a desired pattern onto a substrate and/or in one or more layers on the substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay (the accuracy of alignment of two or more layers in a device) and defocus of the lithographic apparatus. Recently, various forms of scatterometers have been developed including those for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a set of data from which a property of interest of the target can be determined. Determination of the property of interest may be performed by various techniques: e.g., reconstruction of the target structure by iterative approaches such as rigorous coupled wave analysis or finite element methods; library searches; and principal component analysis.

A useful parameter to measure is the so called edge placement error (EPE). This refers to the difference in the actual placement of an edge of a feature in a product structure compared to the desired placement. If edge placement error is not well controlled, contact between features in different layers is deleteriously affected. For example, it may be that features of different layers are no longer in contact when they are desired to be in contact in the finished product. For example, if the size of a feature is different to the desired size, that can mean that a feature in an adjacent layer is erroneously not in contact with it, even if the placement of the adjacent layer relative to the layer in which the feature is positioned is as desired. Conversely, even if a dimension of a feature is accurate, if the positioning of two adjacent layers is inaccurate, this again can mean that a contact which is desired to be there can be missing. So edge placement error is affected by the overlay error and the critical dimension.

Prior art direct measurement techniques for edge placement error are destructive techniques in which a cross section of a substrate is taken and the edge placement error measured using, for example, scanning electron microscopy. Edge placement error may be measured indirectly by measuring overlay and critical dimension. This technique relies on separate measurements of the contributors to the edge placement error. The overlay and critical dimensions are already measured separately using specific test patterns that can be measured without destroying the substrate. However, such specific test patterns often have a different dimension and pitch to the dimensions and pitch of the relevant features within the actual product. Both imaging as well as other processing effects have a contribution to overlay performance that depends on the dimension and pitch of features. Therefore, the difference in dimension and pitch between the specific test patterns for overlay and critical dimension measurement and those of the product limits any correlation between the measurement made on the specific test pattern and the actual overlay error within the product structure.

After a structure has been produced, it is possible to verify contact between features of a device or a test structure using contact probes to connect to the features and to get an analyzer to analyse the structure of the substrate. However, such a process is time consuming and so limits the ability to change the processing conditions of subsequent substrates to account for the measured edge placement error.

The targets used by conventional scatterometers are relatively large gratings, e.g., 40 μm by 40 μm, and the measurement beam generates a spot that is smaller than the grating (i.e., the grating is underfilled). This simplifies mathematical reconstruction of the target as it can be regarded as infinite. However, in order to reduce the size of the targets, e.g., to 10 μm by 10 μm or less, e.g., so they can be positioned in amongst product features, rather than in the scribe lane, metrology has been proposed in which the grating is made smaller than the measurement spot (i.e., the grating is overfilled). Typically such targets are measured using dark-field scatterometry in which the zeroth order of diffraction (corresponding to a specular reflection) is blocked, and only higher orders processed. Examples of dark-field metrology can be found in international patent applications WO 2009/078708 and WO 2009/106279 which documents are hereby incorporated by reference in their entirety. Further developments of the technique have been described in patent publications US20110027704A, US20110043791A and US20120123581A. The contents of all these applications are also incorporated herein by reference.

Diffraction-based overlay using dark-field detection of the diffraction orders enables overlay measurements on smaller targets. These targets can be smaller than the illumination spot and may be surrounded by product structures on a wafer. Multiple targets can be measured in one image.

SUMMARY OF THE INVENTION

It is desirable to measure edge placement error. In particular it is desirable to measure directly and non-intrusively edge placement error.

According to a first aspect, there is provided a method of determining edge placement error within a structure produced using a lithographic process, the method comprising the steps of: (a) receiving a substrate comprising a first structure produced using the lithographic process, the first structure comprising first and second layers, each of the layers having first areas of electrically conducting material and second areas of non-electrically conducting material; (b) receiving a target signal indicative of a first target relative position which is indicative of a target position of edges between the first areas and the second areas of the first layer relative to edges between the first areas and second areas of the second layer in the first structure during said lithographic process; (c) detecting scattered radiation while illuminating the first structure with optical radiation to obtain a first signal; and (d) ascertaining an edge placement error parameter on the basis of the first signal and the first target relative position.

According to an aspect, there is provided an inspection apparatus for determining edge placement error of a substrate produced using a lithographic process, the inspection apparatus comprising: an illumination system configured to illuminate with radiation a first structure produced using the lithographic process, the first structure comprising first and second layers, each of the layers having first areas of electrically conducting material and second areas of non-electrically conducting material; a detection system configured to detect scattered radiation arising from optical illumination of the first structure to obtain a first signal; and a processor configured to ascertain an edge placement error parameter on the basis of the first signal and a signal indicative of a first target relative position which is a target position of edges between the first areas and the second areas of the first layer relative to edges between the first areas and the second areas of the second layer in the first structure during said lithographic process.

According to an aspect, there is provided a one or more patterning devices for determining edge placement error of a substrate produced using a lithographic process, one of the patterning devices comprising first a target pattern comprising: a first sub-pattern configured to produce a first layer of a first structure with a first layer pattern comprising first and second areas; and one of the patterning devices comprising a second target pattern comprising: a second sub-pattern configured to produce a second layer of the first structure with a second layer pattern comprising first and second areas, the second sub-pattern being positioned to have a first predetermined positional offset from a position relative to said first sub-pattern in which the first areas of the first and second sub-patterns just make contact.

According to an aspect, there is provided a substrate for determining edge placement error of a lithographic process used to produce the substrate, the substrate comprising a target comprising a first structure, the first structure comprising at least two layers, each of the layers having first areas of electrically conducting material and second areas of non-electrically conducting material.

According to an aspect, there is provided a method of manufacturing devices wherein a device pattern is applied to a series of substrates using a lithographic process, the method including determining edge placement error of the lithographic process using a method according to the first aspect.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
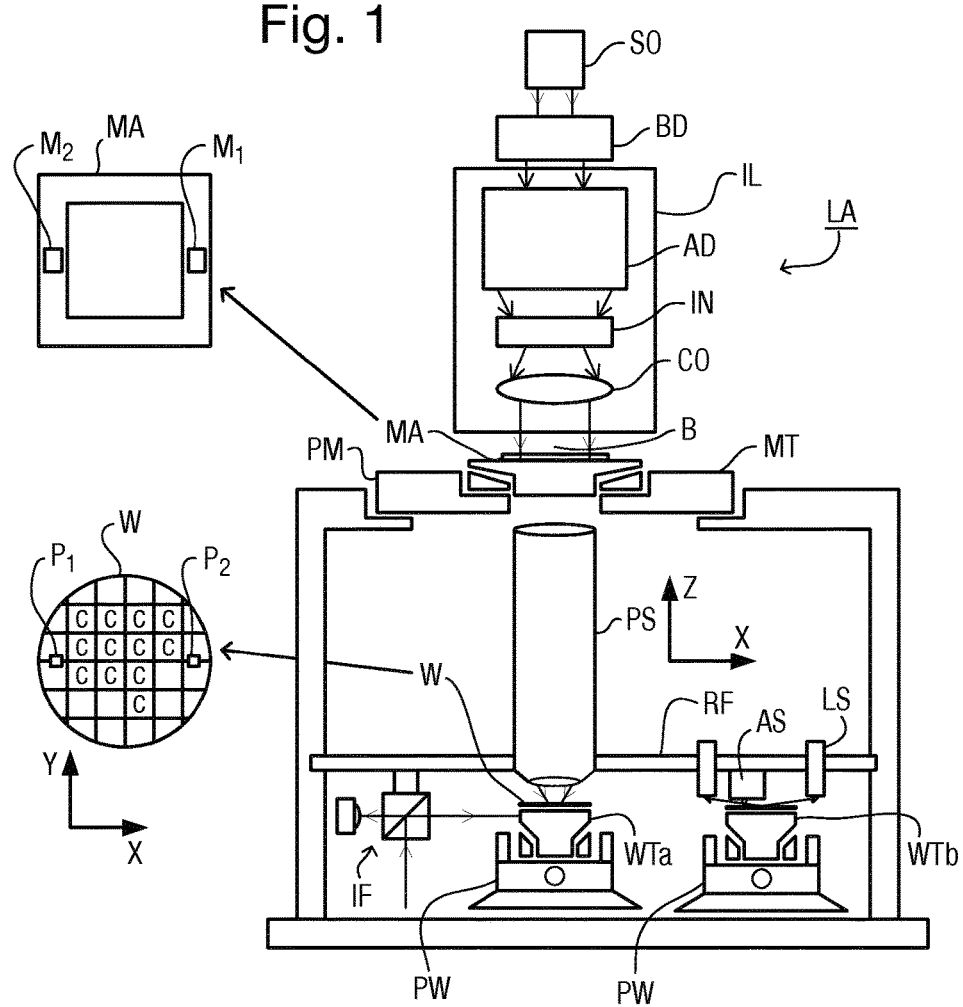
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the patterning device support (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
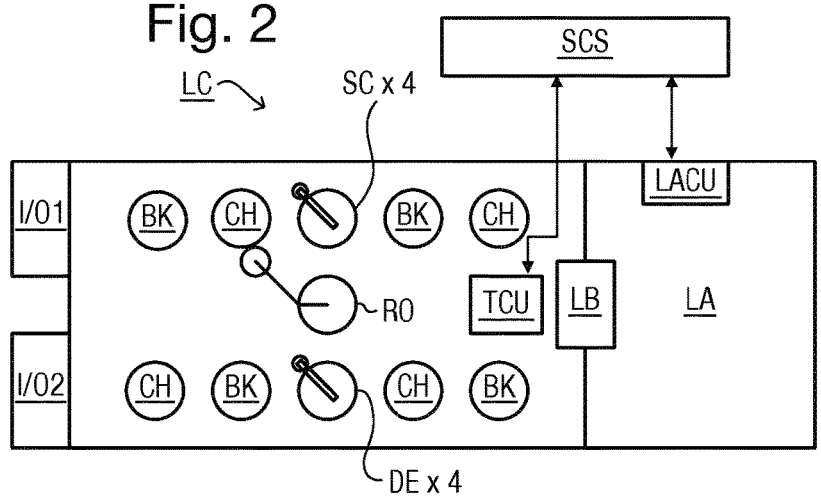
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), edge placement error, etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information. In the present invention the measurement is made after at least two layers which each have first areas of electrically conductive material and second areas of non-electrically conductive material deposited.

Figure 3:
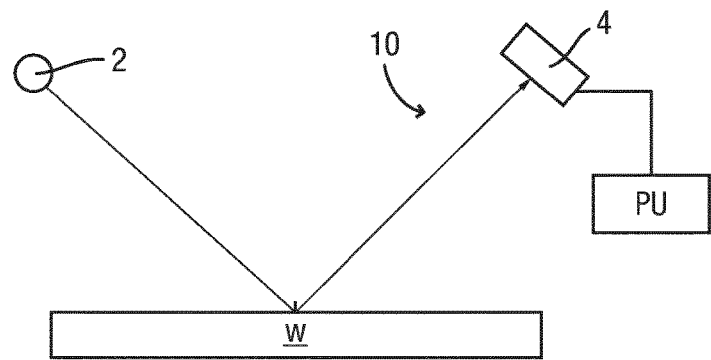
FIG. 3 depicts a first scatterometer.

FIG. 3 depicts schematically a scatterometer which may be used in the present invention. It comprises an optical radiation projector 2 which projects radiation onto a substrate W.

The reflected radiation may be passed to a detector 4 which measures the intensity of the reflected radiation. The detector 4 may measure the intensity of reflected radiation at any angle or over any range of angles. For example, the detector 4 may measure the total intensity of the reflected radiation.

Figure 4:
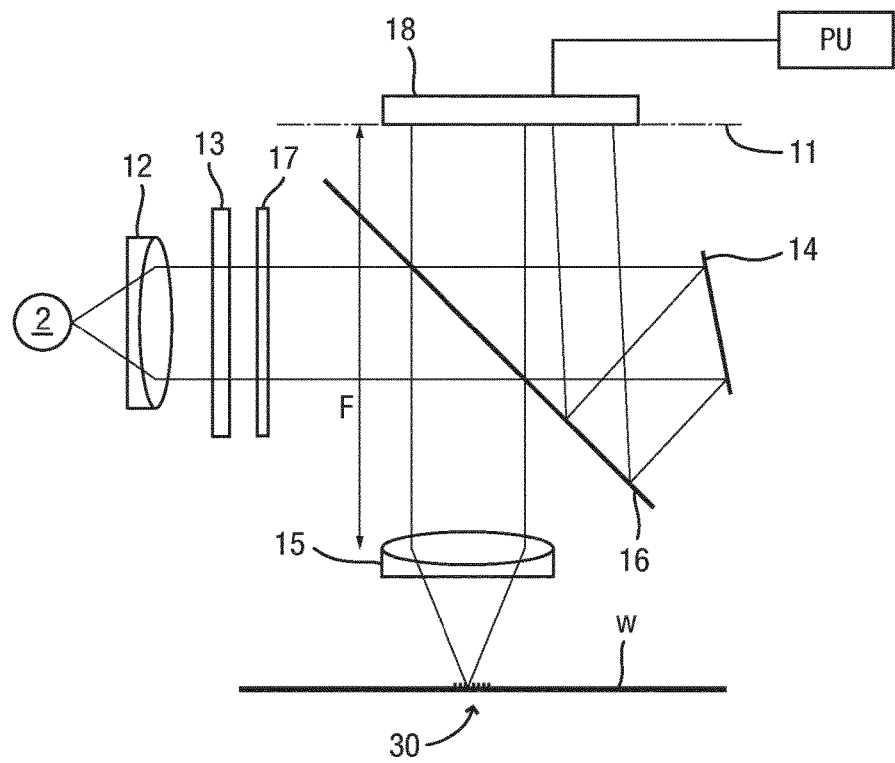
FIG. 4 depicts a second scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflective surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the partially reflective surface 16 part of it is transmitted through the partially reflective surface 16 as a reference beam towards a reference mirror 14. The reference beam is then projected onto a different part of the same detector 18.

The detector 18 may measure the intensity of scattered light at a single wavelength (or a narrow or a broad wavelength range), the intensity separately at multiple wavelengths or integrated over a wavelength range. Furthermore, the detector 18 may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e. twice the bandwidth). Several different portions of an extended radiation source which have been split using, e.g. fiber bundles, may be considered as individual sources. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The principle of the present invention will be explained with reference to FIG. 5. Reflectivity of a grid which has a pitch a lot smaller than the wavelength of incoming radiation varies greatly depending on whether the grid is conductive or not. If the grid is conductive then the grid will reflect the incoming radiation with a high intensity. If on the other hand the grid is not conductive, then the reflectivity of the grid is much lower.

A well known example of this principle is the "Faraday Grid". In a Faraday Grid, lines or a mesh of conductive material reflects electromagnetic waves directed on the grid, if the wavelength of the electromagnetic waves is sufficiently larger than the grid pitch. This principle is used, for example, to shield a microwave oven.

Measurement of edge placement error is a measurement about the juxtaposition of one edge of a feature in a first layer compared to an edge of a feature in an adjacent layer. Therefore, a target can be designed which will be conductive under certain edge placement errors but non conductive with different edge placement errors. By detecting the reflectivity of such a target it is possible to make an inference about the edge placement error present.

Additionally, it is possible to make such a target with features which are of the same or similar dimensions to features of device structure on the same substrate. This has the advantage that the measurement of edge placement error will be performed with features which have similar dimensions and pitch to the product device structure. Therefore, there should be a high correlation between the measured edge placement error using the targets and the actual edge placement error in the product structure of the device.

Figure 5:
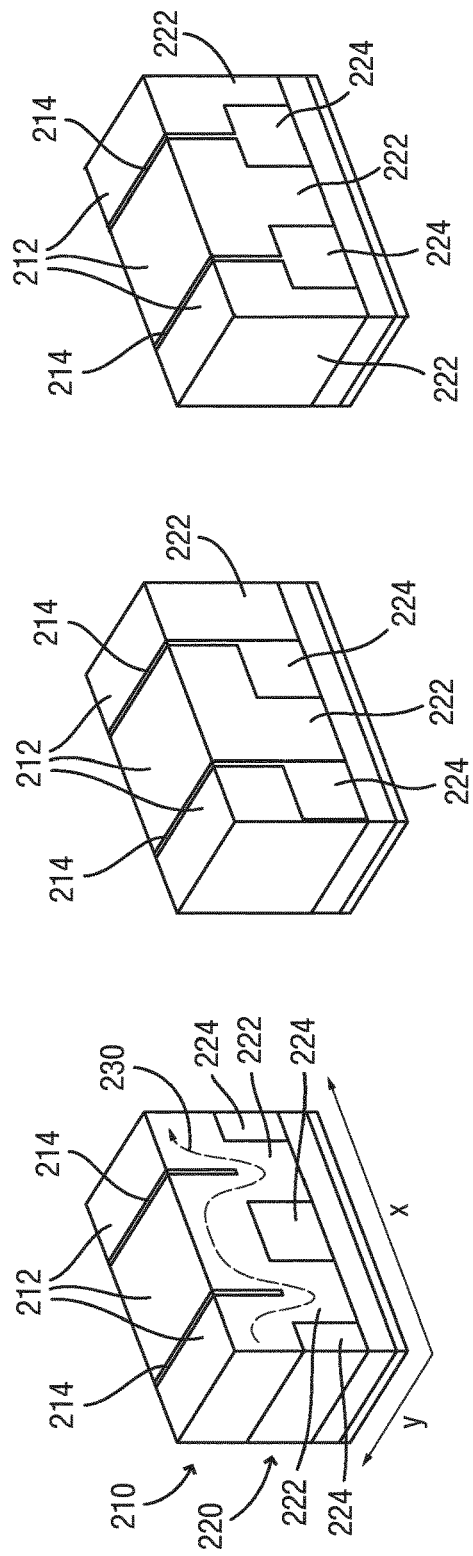
FIG. 5 illustrates, in perspective view, three structures for illustrating the principles of the present invention.

FIG. 5 is a perspective view of three structures which illustrate the theory of the present invention. The structures comprise a first layer 210 and a second layer 220. Both the first and second layers 210, 220 have first areas 212, 222 of electrically conducting material and second areas 214, 224 of non-electrically conducting material.

In the left hand most structure, the relative positioning of the second areas 214, 224 of non-electrically conducting material means that those two areas in the different layers 210, 220 do not make contact. As a result, electrical conduction in a direction (the x direction) parallel to planes of the layers 210, 220 is possible along conduction path 230. As a result, electrical conduction in all directions in the plane of the layers 210, 220 is possible, not just in the direction in which the first areas 212 of electrically conductive material extend. The conduction path 230 passes through a first area 212 of electrically conducting material of the first layer 210, followed by passing through a first area 222 of electrically conducting material of the second layer 220, followed by passing through a first area 212 of the first layer 210 etc.

As a result, when the left hand most structure of FIG. 5 is irradiated with optical radiation and when the first and second areas have suitable dimensions (a pitch much lower than the wavelength of the radiation), the structure will strongly reflect the incident radiation, as it is electrically conductive and therefore strongly reflective.

The center and right hand most structures of FIG. 5 however, have the second areas 214, 224 of the first and second layers 210, 220 aligned such that they touch each other. As a result, there is no conductivity path and electrical conduction through the structure in all directions (particularly the x direction) parallel to planes of the layers 210, 220 is prevented. As a result, any incident optical radiation on the structures will be reflected with a intensity lower than on the structure on the left hand side of FIG. 5. It should be noted, that if only a small amount of non-electrically conductive material is between the electrically conductive first areas 212, 222 of different layers 210, 220, capacitive coupling between the electrically conductive first areas 212, 222 will be present and the structure will behave in a similar way to a structure which conducts electricity in two directions. As a result the reflected radiation will have a high intensity.

It will be apparent that both the left and right hand structures of FIG. 5 require a greater overlay error or critical dimension variation in order for the conducting and non-conducting nature of the structures respectively to change to non-conducting or conducting. Conversely the central structure of FIG. 5 would require only a small displacement of the first layer 210 to the right as illustrated relative to the second layer 220 in order for a conduction path in a direction parallel to planes of the layers and perpendicular to the direction in which the first areas 212, 214 extend to be set up. Additionally, only a small change in the dimension of the second areas 214, 224 of the first or second layers 210, 220 is required in order for a conduction path in the x direction to be set up. For example, if the second areas 224 of the second layer 220 were reduced in size, contact between the second areas 224 of the second layer 220 and the second areas 214 of the first layer 210 would be lost and a conduction path in the x direction would be established.

Therefore, it is apparent from FIG. 5, if the structures illustrated in FIG. 5 are used as target structures, that any edge placement error introduced by the lithographic process might be detectable by variations in the reflectivity of the actual structure produced, compared to the expected reflectivity of the target structure. In particular with the case of the central structure of FIG. 5, even a small deviation from the target structure in the actually produced structure could result in a large change in reflectivity.

An apparatus such as that of FIG. 3 or 4 may be used to illuminate the structure. A signal obtained by the detector 4/18 indicative of the intensity of reflected radiation may be obtained. The radiation detected by the detector 4 may be zero order reflected radiation and/or may be first or higher diffraction order of reflected radiation (as described below in more detail with reference to FIG. 12). The detector 4/18 may detect radiation at a given angle of reflection, over a range of angles of reflection or over all angles of reflection. The intensity of optical radiation received by detector 4/18 will vary dependent upon the reflectivity of the structure being illuminated.

The geometry of the structures of FIG. 5 is one of both layers having a pattern which comprises substantially parallel straight lines extending in a first direction (the y direction as illustrated). The conducting path 230 is in a direction perpendicular to the direction in which the lines which make up the first and second areas extend. This geometry can be thought of as a one dimensional geometry. However, other geometries are possible, including two dimensional patterns, in plan, and three or more layers. In an embodiment, the first and second layers 210, 220 have different patterns of first and second areas 212, 222, 214, 224 to each other.

The first and second layer 210, 220 patterns are a repetitive pattern. In an embodiment the first and second layer patterns of each structure have the same pattern and/or dimensions. In an embodiment the repetitive pattern may comprise parallel lines of substantially equal width and substantially constant pitch. In an embodiment the same pattern in different layers may comprise in both cases lines extending in substantially parallel directions but the pitch and/or width of the lines may vary between the two layers. The width and pitch of the lines and indeed the thickness of the layers 210, 220 can be varied as desired. In an embodiment, the width and/or pitch of the lines is of the same order of magnitude as the width and pitch of a device structure on the substrate. In an embodiment, for at least one layer, the first areas 212, 222 of electrically conducting material are wider than the second areas 214, 224 of electrically non-conducting material.

The measurement of edge placement error using the above described structures is likely closely to match the actual edge placement error in the device formed on the substrate. In an embodiment the first and second areas (e.g. lines) have a plan dimension (e.g. a width) in at least one direction (in the y direction as illustrated) of between 2 and 50 nm, desirably between 2 and 20 nm. In an embodiment a pitch between the first and second areas is of the order of 5-100 nm, desirably 10-50 nm.

The whole of the structure may have a plan dimension of between 5 μm×5 μm and 50 μm×50 μm, preferably between 10 μm×10 μm and 20 μm×20 μm in the plane of the layers 210, 220 of the structure. The beam of the radiation source 2 may have an equivalent dimension when impinging on the structure so that any reflection of the beam from the radiation source 2 is a result of reflection by the structure.

In the embodiment of FIG. 5, the structure is shown as being formed by the top two layers 210, 220 of the substrate. However, this is not necessarily the case and the two layers 210, 220 of the structure may be covered by further layers, particularly by layers transparent to the wavelength of the illumination radiation being used.

The wavelength of the impinging radiation should be an optical wavelength, for example between 400 and 700 nm. Desirably the wavelength is above 500 nm. For the case where the electrically conducting material is copper, gold or silver, a wavelength of between 600 and 700 nm is preferred. The wavelength at which the effect described in connection with FIG. 5 can be achieved is material dependent. Other materials which could be used as the electrically conducting material include aluminium and platinum. It is desirable to use the same metals for the electrically conductive material as used in the device structure as this will both improve the correlation of edge placement error in the structure and the device and will also ease in manufacture of the structure.

In order to make the structure, first and second patterning devices MA are provided. The first and second patterning devices MA comprise patterns for producing features in a layer on a substrate. The first and second patterning devices MA optionally include features for producing devices on the substrate as well as first and second sub-patterns for producing the patterns of the first and second layers 210, 220.

A first sub-pattern of the first patterning device MA is configured to produce a first layer 210 of a structure with a first layer pattern which comprises the first and second areas 212, 214 of FIG. 5. A second sub-pattern of the second patterning device MA is configured to produce a second layer 220 of the same structure with a second layer pattern comprising first and second areas 222, 224. The second sub-pattern is positioned on the second patterning device to have a first predetermined positional off-set from a position relative to the first sub-pattern on the first patterning device. The first predetermined positional off-set is desirably an off-set from a position at which the first areas 212, 222 of the first and second sub-patterns just make contact (i.e. a position of greatest sensitivity to overlay and critical dimension errors and therefore edge placement error).

The first and second patterning devices MA are configured to produce features of the structure for the measurement of edge placement error with the above mentioned dimensions.

Figure 6:
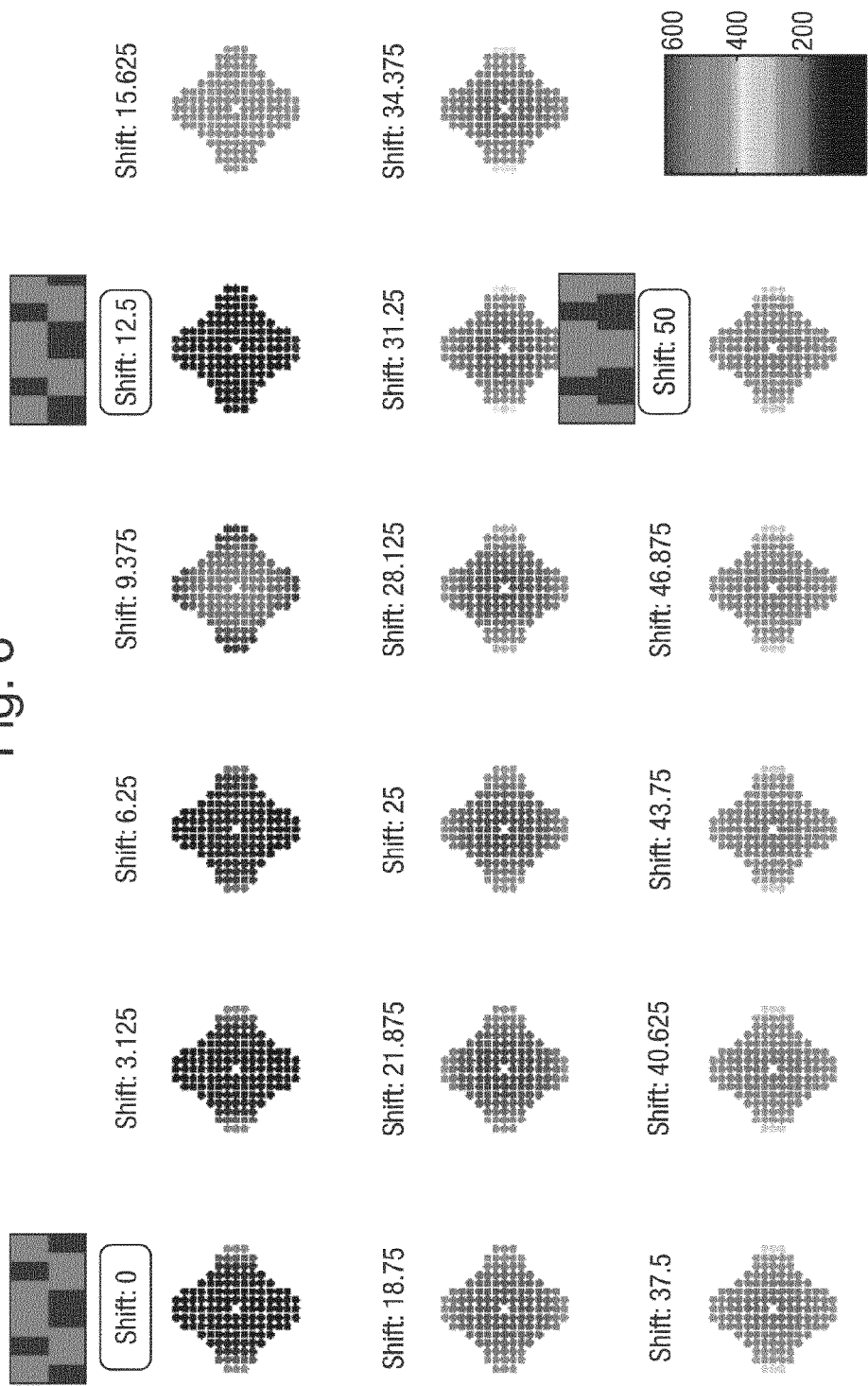
FIG. 6 is a reflectivity pupil plot as a function of relative layer shift of copper.

FIG. 6 is a series of pupil plots in which the intensity of all reflected radiation is plotted for different azimuthal and incident angles of incoming radiation. The incoming radiation has a wavelength of 700 nm, the pitch is 100 nm and the thickness of the first and second layers 210, 220 is 75 and 50 nm respectively.

The electrically conducing material used is copper and the non-electrically conducting material used is an ultra low k dielectric (k=2.4). Several different structures are produced with different amounts of shift (in nm) from the position illustrated in the left hand drawing of FIG. 5 (and at the top left of FIG. 6) at which a second area line of the first layer is positioned, in plan, equidistantly between second areas of the second layer. The shift indicates the amount of movement of the upper layer relative to the lower layer in the left hand direction. At a shift of 12.5 nm the non-electrically conducting material of the second areas 214, 224 of the first and second layers 210, 220 just touches thereby preventing electrical conduction through the structure in the direction parallel to the planes of the layers and parallel to the lines of copper.

As can be seen from FIG. 6, there is a large change in reflectivity between the shifts where the structure is electrically conductive (shift of 12.5 nm and below) and the case where the structure is non-conductive (above a shift 12.5 nm). The large change in reflectivity is indicative of a change from the structure being electrically conductive (or the electrically conducting lines being close enough together to allow capacitive coupling) to a structure which is not electrically conductive (and the electrically conducting lines not being close enough together to allow capacitive coupling). These results in FIG. 6 indicate that the reflectivity is higher when the structure is non-electrically conductive. For other structures it may be the opposite way round namely as described elsewhere, that the reflectivity of electrically conductive structures is higher than that of non-electrically conductive structures. The present invention can be used with either type of change in reflectivity.

Figure 7:
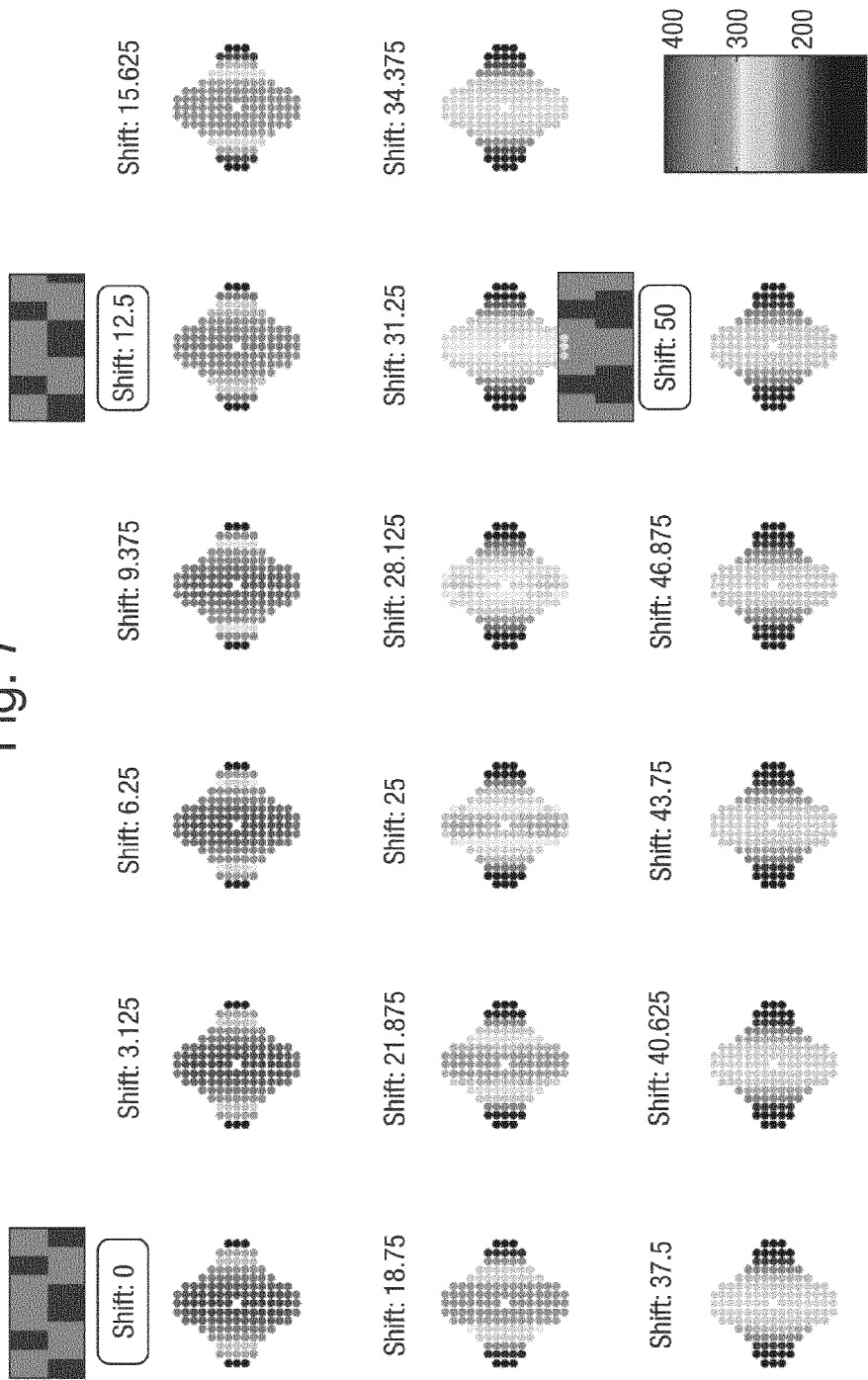
FIG. 7 is a reflectivity pupil plot as a function of relative shift of silicon.

In order to confirm that the effect illustrated in FIG. 6 is the result of the change in conductivity of the structure, a second experiment was performed in which the copper lines of the FIG. 6 experiment were substituted with silicon and the remaining parameters remained the same. The results are illustrated in FIG. 7. As can be seen, there is a gradual change in reflectivity depending on the amount of shift, but no step change in reflectivity at the position where the first and second areas just touch (a shift of 12.5 nm).

Figure 8:
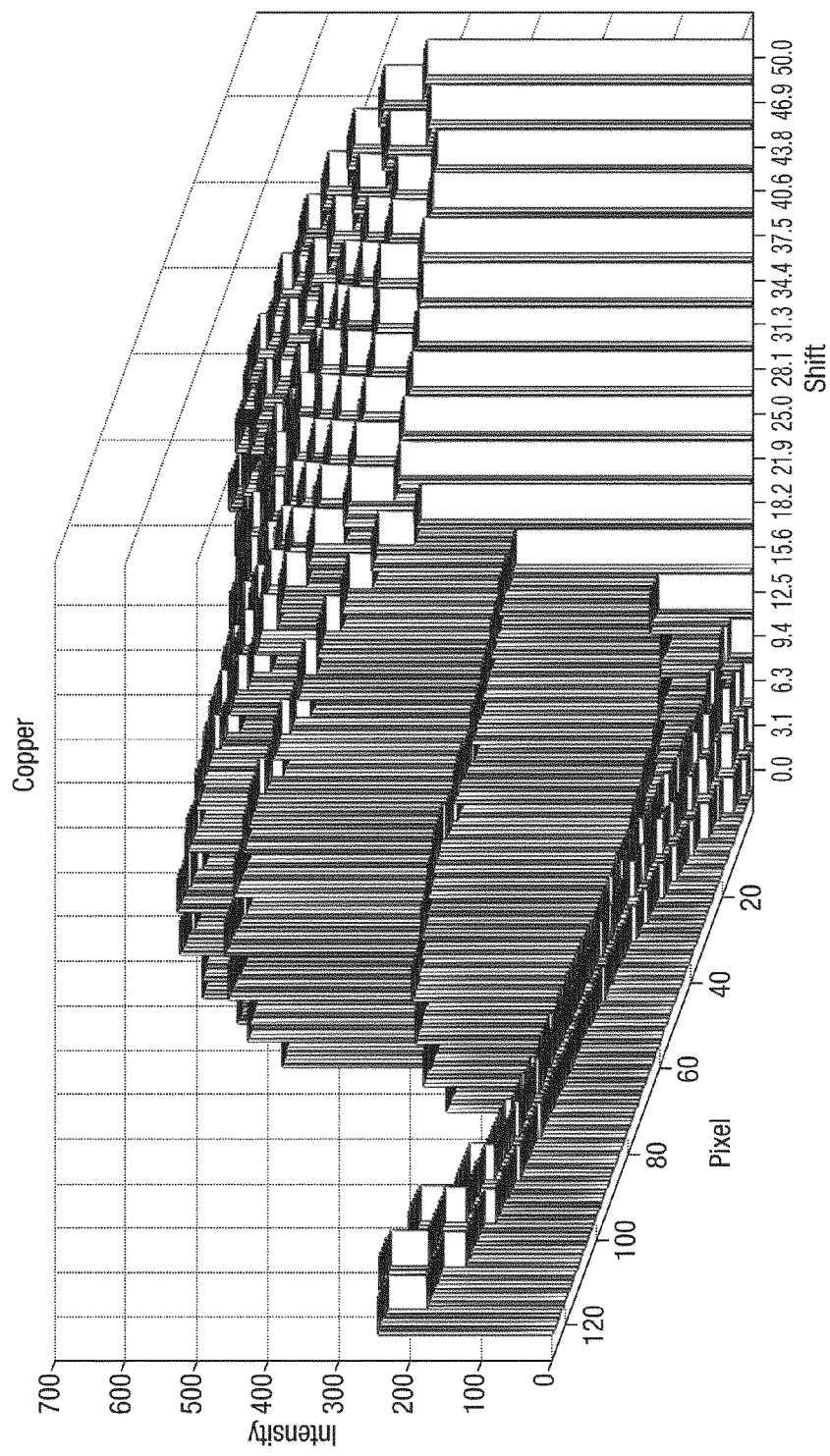
FIGS. 8 and 9 are bar plots of intensities as a function of shift of copper and silicon respectively.
Figure 9:
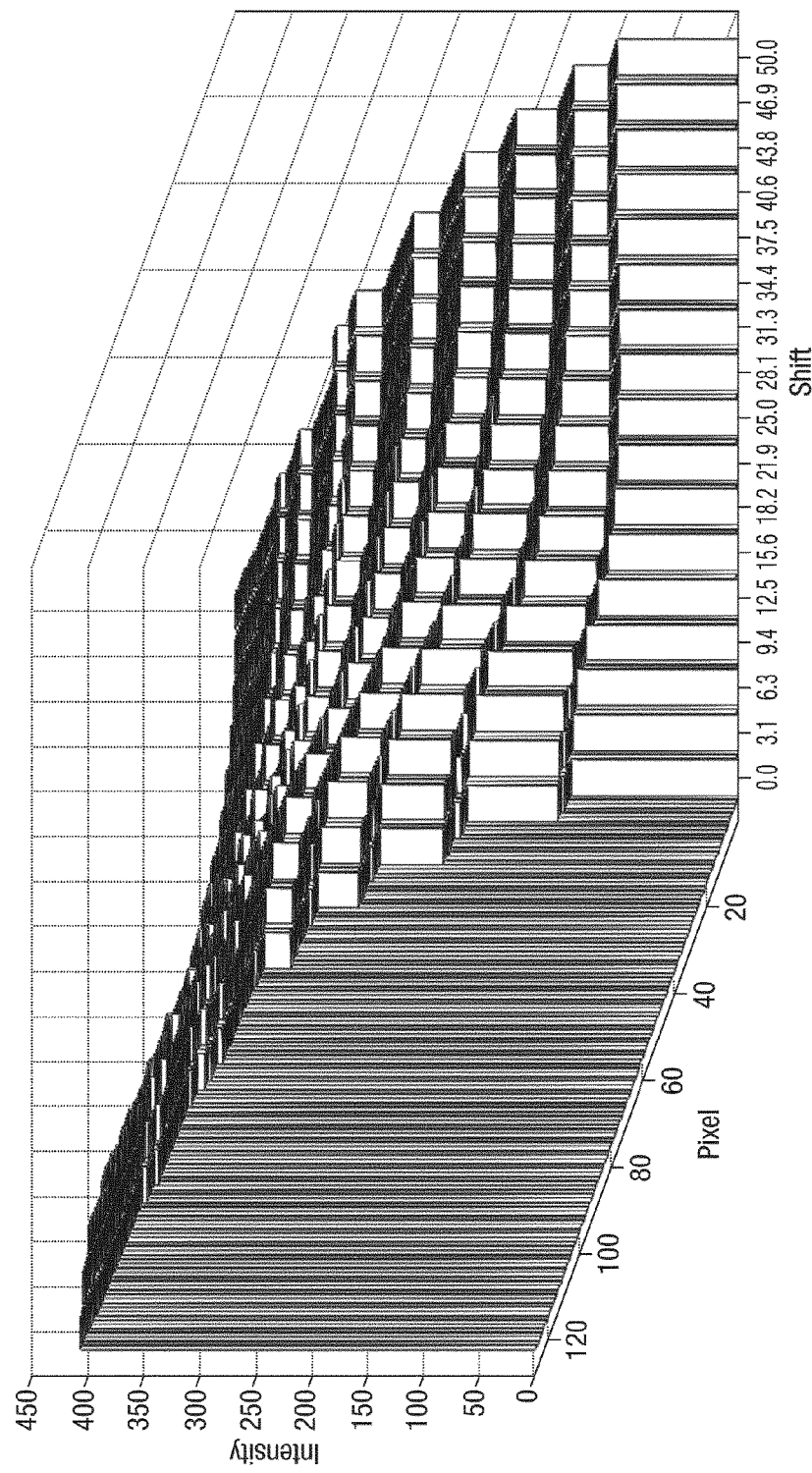

FIGS. 8 and 9 illustrate the same results as in FIGS. 6 and 7 respectively but plotted in a different format which illustrate the change in reflectivity even more clearly. The shift is plotted along the x-axis and along the z-axis the intensity of reflected light. Along the y axis the intensity of each of the pixels of the detector is plotted. It is immediately apparent from FIG. 8 that for the shifts above 12.5 nm the reflectivity is much greater than for shifts of 12.5 nm and lower. Conversely, for the structure comprising silicon instead of copper vias, the change in reflectivity with shift is completely smooth.

Figure 10:
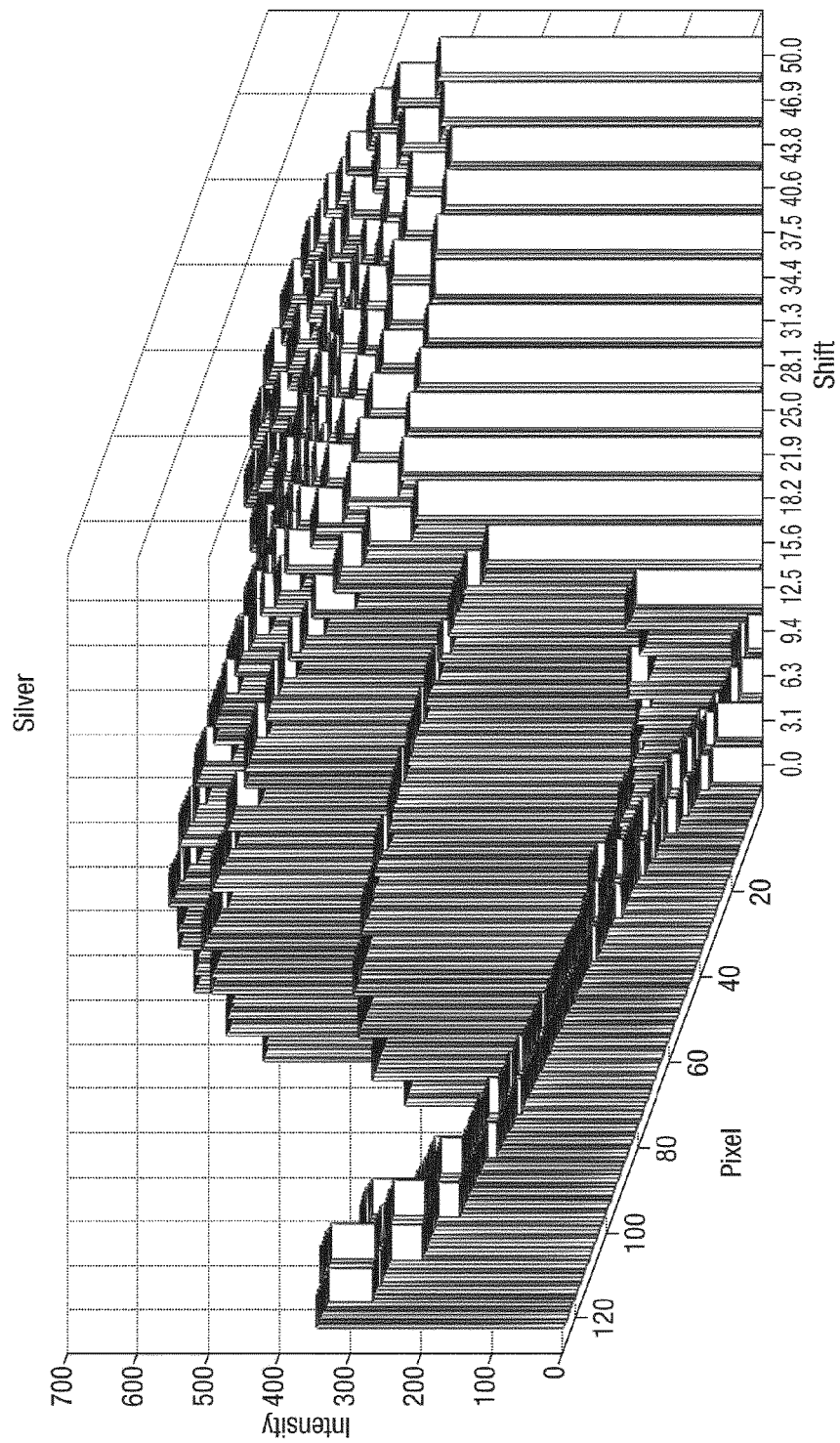
FIGS. 10 and 11 are reflectivity bar plots of intensities as a function of relative layer shift of gold and silver respectively.
Figure 11:
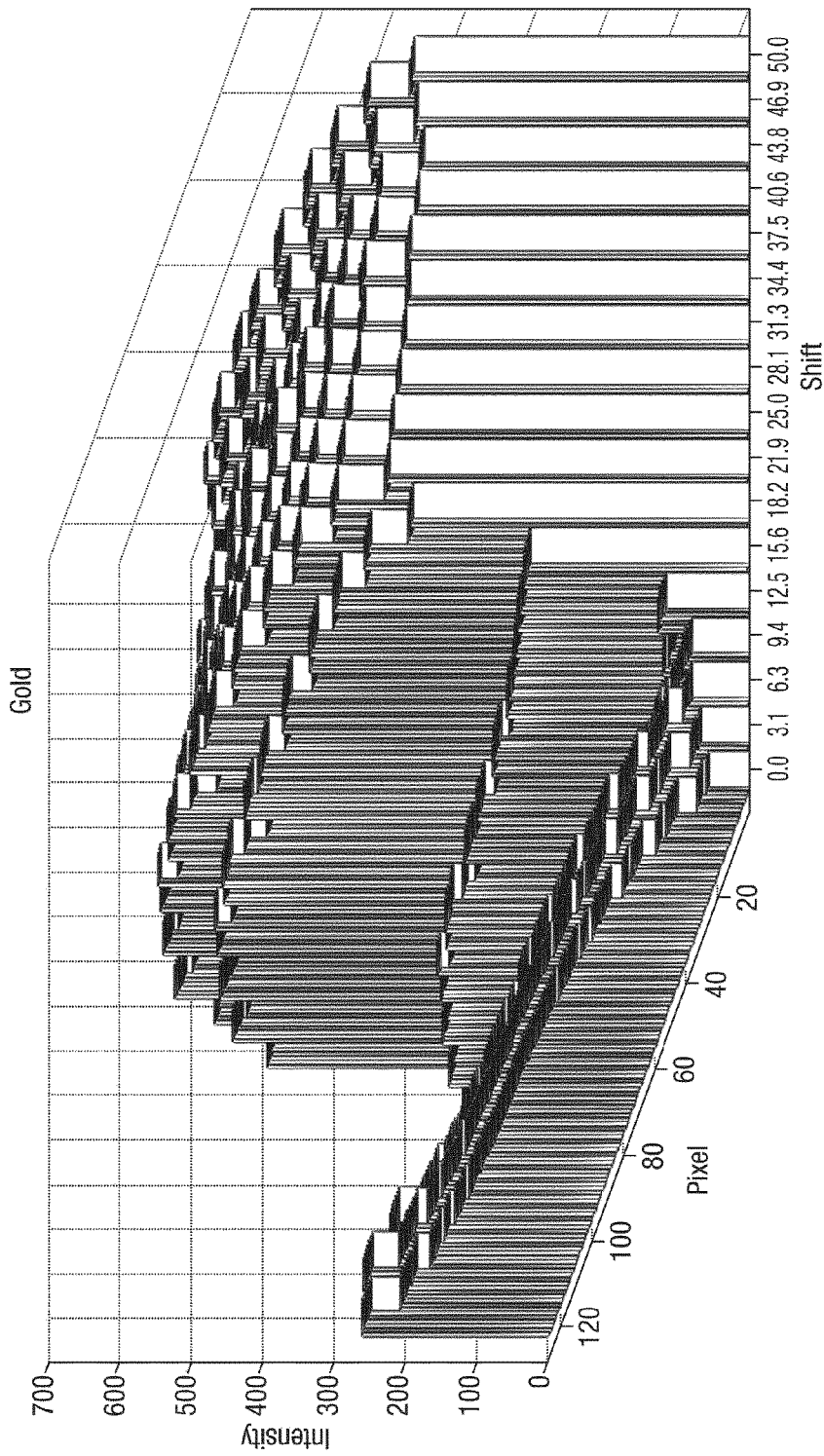

The same experiments have been performed using gold and silver lines instead of copper. These results are plotted in a format corresponding to FIG. 8 in FIGS. 10 and 11 respectively and show the same behaviour. Other materials which are suitable include tungsten, aluminium, metal nitrides, TiN, TaN, TiSiN, NbN, MoN, WNX.

The present invention will be described with reference to the structure illustrated in FIG. 5. However, other types of structure may be used including those with a non repetitive pattern, those with a two dimensional pattern in one or both layers and those with more than two layers. As long as some variations in overlay and critical dimension (i.e. edge placement error) result in a change in conductivity in all directions in the plane of the layers then the present invention can be used to generate an edge placement error parameter indicative of the edge placement error on the basis of the techniques described herein.

The present invention uses the phenomena of the large step change in reflectivity between an electrically conducting and a non-electrically conducting structure in order to calculate a edge placement error parameter. The edge placement parameter is a measure of the difference between the target relative position and the actual relative position.

A structure is produced using a lithographic process on a substrate. First and second layers each having first areas of electrically conducting material and second areas of non-electrically conducting material are produced on the substrate with a known first target relative position (set during the manufacture of the patterning devices). In an embodiment target relative position is a measure of the target position of edges of the second areas of the first layer relative to edges of the second layers of the second layer (e.g. a measure of the shift of FIGS. 6-11). In an embodiment the target relative position incorporates information about both the dimension of the first and second areas, as well as their relative position between layers. The actual relative position will vary from the target relative position due to edge placement error. A measure of the difference between the actual relative position and the target relative position will therefore be a measure of edge placement error.

After the structure has been produced, it is placed in an inspection apparatus such as illustrated in FIGS. 3 and 4 and is illuminated by an optical radiation projector 2. Scattered radiation is detected by a detector 4 to obtain a first signal. A processor PU ascertains an edge placement error parameter on the basis of the first signal and a signal indicative of the first target relative position. From the first target relative position it is known whether a prefect structure with no edge placement error at all should be conductive in a direction parallel to planes of the layers and parallel to the lines of electrically conducting material. From that knowledge it is known whether or not the reflectivity should be high or low with no edge placement error. The reflectivity can be determined to be high or low for example by comparing the measured intensity of reflected radiation to a value, for example a predetermined value. If the reflectivity as measured by the first signal is as expected (high or low) for the target relative position, an edge placement error parameter will indicate that the edge placement error is not so great. On the other hand, if the reflectivity is different to that expected from the target relative position, the edge placement error parameter will indicate that the edge placement error is great enough to change the electrically conducting property of the structure.

In an embodiment, from a knowledge of the pattern and dimensions of the first and second areas 212, 214, 222, 224 of the first and second layers 210, 220 the amount of edge placement error needed to change from a highly reflective to a less reflective structure or vice versa can be established. From that information and a knowledge of whether the reflectivity changed in practice, the edge placement error parameter can indicate an amount of edge placement error.

Figure 12:
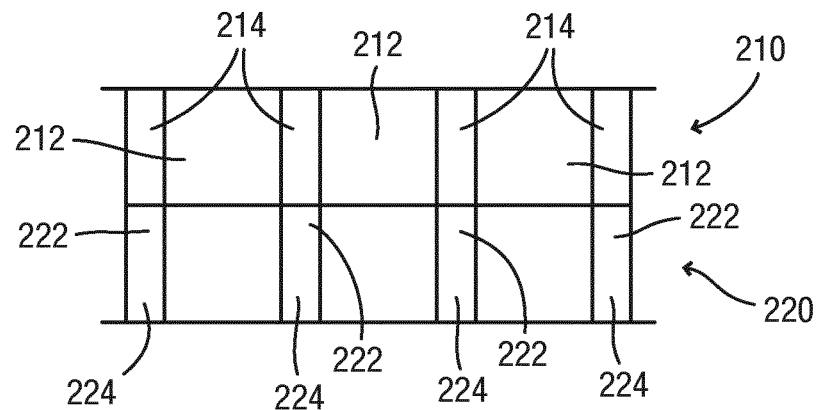
FIG. 12 illustrates, in cross-section, an example structure used in the determination of an edge placement error parameter.

As an example, in one embodiment, relatively narrow second areas 214, 224 of non-electrically conducting material can be used and the second areas 214, 224 can have a target relative position of one above the other as illustrated in FIG. 12. For such a target relative position it would be expected that the reflectivity is relatively low because electricity cannot be conducted in the x direction. However, only a small overlay error (shifting of the position of the second areas 214 of the first layer 224 to the left or right) or a small change in the critical dimension (for example a reduction in the width of both of the second areas 214, 224 of the first and second layers 210, 220) would lead to the second areas 214, 224 of the first and second layers 210, 220 no longer being in contact. This would allow electrical conduction through the first structure in the x direction and thereby a high reflectivity, contrary to what is expected from the known target relative position.

Therefore, in one embodiment the first signal represents the intensity of the scattered radiation (this may be the intensity at a certain azimuthal angle and incident angle and/or over a certain range of azimuthal and incident angles and/or over all azimuthal and incident angles). The processor PU then ascertains that the second areas 214, 224 of non-electrically conducting material in different layers 210, 220 do not contact each other if the first signal is greater than a value (for example a predetermined value or a value generated from a target of known reflectivity or a value obtained by illuminating a different structure in the substrate) and that the second areas 214, 224 of non-electrically conducting material in different layers 210, 220 contact each other if the signal is less than the value. The processor PU then compares that finding with a signal indicative of the target relative position (and so the expected high or low reflectivity of the target relative position if no edge placement error exists) to ascertain the edge placement error parameter.

The example structure in FIG. 12 is only one example and other geometries and relative positioning of the first and second layers 210, 220 could be used and would determine different aspects of any edge placement error. Additionally, it is possible to place the structures on the substrate with different orientations (for example placing the structure on the substrate such that the lines of electrically conducting material extend in the x direction or any other direction in the x y plane.

If more than one structure as described above is produced on the substrate, more information will be obtainable about the edge placement error. In an embodiment the substrate has two (first and second) structures produced on it using a lithographic process. Both the first and second structures comprise first and second layers 210, 220 each having first areas 212, 222 of electrically conducting material and second areas 214, 224 of non-electrically conducting material.

In an embodiment the first and second structures are illuminated separately and separate first and second signals are obtained from the detected scattered radiation. The processor PU then ascertains the edge placement error parameter on the basis of the first and second signals as well as the target relative position of the first structure and the target relative position of the second structure. The two structures may be the same or different. In one embodiment the structures are the same except that the two structures have different orientations. In another embodiment the structures are the same (in that they have the same line width and pitch in each of the layers) except that the first and second layers have different off-sets from the position at which the second areas of the different layers just touch each other (e.g. different shifts as described above is relative to FIG. 6).

In an embodiment, the first and second signals are processed as described above with respect to only one structure being present. The edge placement error parameter accounts for both results.

In another embodiment, the first and second signals are compared to one another. If the signals are more than a value, for example a predetermined value, different from each other it will be apparent than one of the structures conducts electricity in both the x and y directions (the one with the signal of greater magnitude) whereas the other (the one with the signal of lower magnitude) does not. Using this knowledge and the knowledge of the target relative positions of the first and second layers and whether in those target relative positions conduction in the x and y directions would be expected, the processor PU can generate an edge placement error parameter.

In an embodiment the substrate comprises more than two of the structures as described above.

In an embodiment each of the structures has a different target relative position, for example the shift between the first and second layers 210, 220 is different for each of the structures. By obtaining a signal indicative of the reflectivity of each of those structures, it will be possible to determine an edge placement error parameter which is indicative of the amount of deviation of edge placement from the target position. This will be explained with reference to FIG. 6.

FIG. 6 illustrates the reflectivity of various target relative positions in the absence of any edge placement error. A deviation from the case where the reflectivity changes significantly between the 12.5 and 15.625 shifts, would indicate that edge placement error is present. The position to which the change in reflectivity changes indicates a level of edge placement error. For example, a shift in the position of change in reflectivity to between the 9.375 and 12.5 shift would indicate a small edge placement error. However, a shift to a position of change in reflectivity to between the 28.125 and 31.25 shifts would indicate a much larger edge placement error. The direction of movement of the position of change in reflectivity will also indicate a character of the edge placement error (for example an overlay error in the plus x or minus x direction). If a series of structures is provided with lines extending in the x direction and a separate set of structures provided with lines extending in the y direction, for example, any asymmetry in the edge placement error will also be detectable.

In an embodiment, instead of each of the structures having a constant positional relationship between second areas of the first and second layers, a target relative position with a continuous change in shift can be used. The optical radiation projector 2 can then illuminate the structure (which can be considered as being a plurality of structures each with a single line in the first layer, for example) from one end to the other and collect a signal representative of the change of reflectivity along the length of the structure. The position at which there is a great change in reflectivity will then be indicative of the edge placement error. In an embodiment, the processor PU compares the position at which the target relative position of the first and second layers would result in a step change in reflectivity and to the actual position at which the step change in reflectivity occurs. The difference in those two positions is indicative of the edge placement error and may be used to generate the edge placement error parameter.

Figure 13:
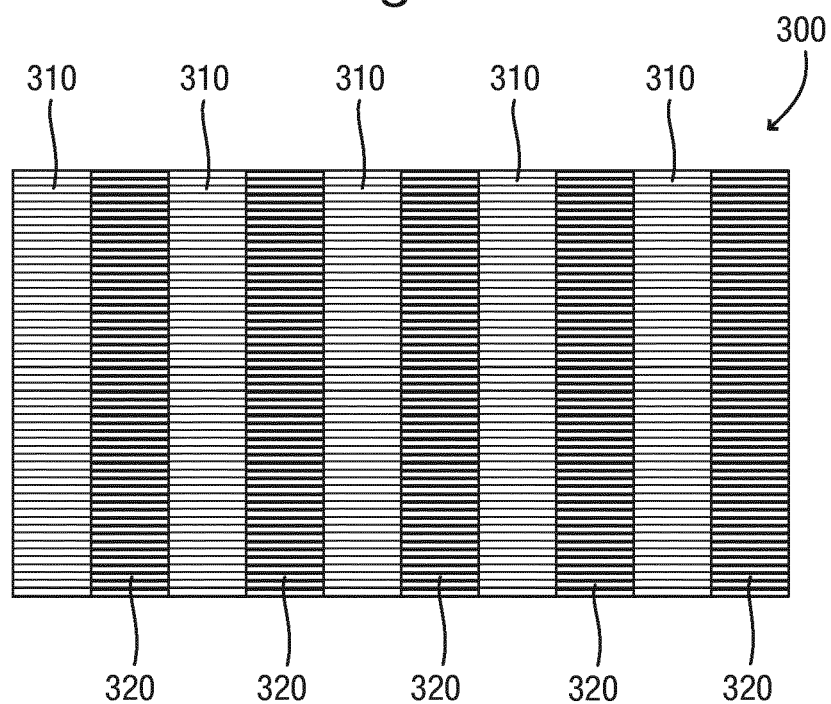
FIG. 13 illustrates a row of structures, in plan, used for the measurement of an edge placement error parameter.

As described above, dark field scatterometry can result in higher accuracy of any measured parameter. Therefore, in one embodiment the zero order reflection is excluded from the measured signal so that the first signal is representative of first and/or higher orders of reflection. In order for this system to be useful, a diffraction pattern must be present on the substrate. The diffraction pattern is produced by lining up multiple structures as described above in a row 300 as illustrated in FIG. 13. The structures alternate between a first set 310 which have the same target relative position and a second set 320 which have a second target relative position.

The first and second target relative positions are different. The first and second target relative positions may be different to each other in one or more of the following ways: shift (especially in the case where the patterns and geometry are otherwise the same), width and/or pitch of the first and/or second areas of the first and/or second layer. If the row 300 of structures is illuminated at once, if both the first and second target relative positions, incorporating the actual edge placement error, have the same or similar reflectivity, no first order diffraction signal will be present. However, if the first and second target relative positions, after incorporating the actual edge placement error, have significantly different reflectivity (i.e. the structures of one of the first and second sets are conductive and the other of the first and second sets are not conductive), then a first and higher order reflection will be present.

From a knowledge of the first and second target relative positions of structures, it is possible to ascertain an edge placement error parameter with a high degree of certainty because of the very strong indicator of the presence or otherwise of the first and/or higher order diffraction.

As with all the other embodiments, more than one row with different orientations and/or different patterns and/or geometry of patterns and/or different first and second target relative positions can be provided and the processor PU, using a knowledge of the target relative positions and orientations, can calculate an edge placement error parameter which is indicative of features of the actual edge placement error.

In an aspect of the present invention, there is provided a computer program or computer program product which, when executed on a computer, performs the ascertaining of an edge placement error parameter as described herein above.

In an embodiment, there is provided a method of determining edge placement error within a structure produced using a lithographic process, the method comprising the steps of: receiving a substrate comprising a first structure produced using the lithographic process, the first structure comprising first and second layers, each of the layers having first areas of electrically conducting material and second areas of non-electrically conducting material; receiving a target signal indicative of a first target relative position which is indicative of a target position of edges between the first areas and the second areas of the first layer relative to edges between the first areas and second areas of the second layer in the first structure during said lithographic process; detecting scattered radiation while illuminating the first structure with optical radiation to obtain a first signal; and ascertaining an edge placement error parameter on the basis of the first signal and the first target relative position.

In an embodiment, the first signal represents the intensity or phase of the scattered radiation and the ascertaining step (i) finds that the second areas of non-electrically conducting material in different layers do contact each other or that the first areas of electrically conducting material in different layers contact each dependent upon whether the first signal is greater than or less than the value, and (ii) compares that finding with the first target relative position to ascertain the edge placement error parameter. In an embodiment, the substrate further comprises a second structure produced using the lithographic process, the second structure comprising first and second layers each having first areas of electrically conducting material and second areas of non-electrically conducting material, and the method further comprises the step of detecting scattered radiation while illuminating the second structure with optical radiation to obtain a second signal, wherein the edge placement error parameter is additionally based on the second signal and a second target relative position which is indicative of a target position of edges of the second areas of the first layer relative to edges of the second areas of the second layer in the second structure during said lithographic process. In an embodiment, the ascertaining is at least partly based on a comparison of the first and second signals. In an embodiment, the ascertaining finds, if a difference in magnitude between the first and second signals is greater than a predetermined value, that one structure of the first and second structure has second areas of non-electrically conducting material in different layers not contacting each other and that the other structure of the first and second structure has second areas of non-electrically conducting material in different layers contacting each other and compares that finding with the first target relative position and second target relative position to ascertain the edge placement error parameter. In an embodiment, the first target relative position and second target relative position have different positional off-sets from a position at which the first areas of different layers just make contact. In an embodiment, in the first structure the first areas of electrically conducting material in different layers contact each other or are close enough to allow capacitive coupling and in the second structure the first areas of electrically conducting material in different layers do not contact each other or are not close enough to allow capacitive coupling. In an embodiment, the substrate further comprises at least one further structure produced using the lithographic process, each of the at least one further structures comprising first and second layers, each of the layers having first areas of electrically conducting material and second areas of non-electrically conducting material, and the method further comprising the step of detecting scattered radiation while illuminating the at least one further structure with optical radiation to obtain at least one further signal, wherein the edge placement error parameter is additionally based on the at least one further signal and at least one further target relative position which is indicative of a target position of edges of the first areas of the first layer relative to edges of the first areas of the second layer in the at least one further structure during said lithographic process. In an embodiment, the first, second and further structures are positioned adjacent each other in a row and the structures alternate between a first set which have a target relative position equal to the first target relative position and a second set that have a target relative position equal to the second target relative position. In an embodiment, the detecting steps detect scattered radiation while illuminating the first, second and further structures in the row with optical radiation and detecting the combined scattered radiation to make a detection signal. In an embodiment, the detecting steps detect first and/or higher orders of scattered radiation. In an embodiment, the ascertaining step comprises comparing the first order detection signal to a value and determining on that basis whether neither or one or both of the first and second sets have structures with second areas of non-electrically conducting material in different layers not contacting each other and uses that determination to ascertain the edge placement error parameter. In an embodiment, the structure comprises at least one further row of said further structures which alternate between a first set which have a target relative position different to a target relative position of the other further structures which make a second set of the same row. In an embodiment, the rows each have structures with different target relative positions, and the detecting steps detect for each row first and/or higher order scattered radiation while illuminating the corresponding row with optical radiation to obtain a corresponding first and/or higher order detection signal, and the ascertaining step compares the first and/or higher order detection signals of the rows and on that basis determines which of the rows have neither or one or both of the first and second sets of each row with structures with second areas of non-electrically conducting material in different layers not contacting each other and uses that determination to ascertain the edge placement error parameter. In an embodiment, the first and second areas have a repetitive pattern. In an embodiment, the repetition has a pitch of the order of 5-100 nm, desirably 10-50 nm. In an embodiment, the first and second areas of each structure have the same pattern and/or critical dimensions. In an embodiment, the first and second areas of a structure comprise substantially parallel lines. In an embodiment, the first and second areas have a critical dimension of the same order of magnitude as features of a device structure on the substrate. In an embodiment, at least one of the first and second areas have a critical dimension in at least one direction of between 2 and 50 nm, desirably between 2 and 20 nm. In an embodiment, the structure(s) has (have) a plan dimension of between 5 µm×5 µm and 50 µm×50 µm, preferably between 10 µm×10 µm and 20 µm×20 µm. In an embodiment, the electrically conducting material is one or more of copper, silver, gold, tungsten, aluminum, metal nitrides, TiN, TaN, TiSiN, NbN, MoN, WNX. In an embodiment, the detecting comprises measuring the intensity of radiation reflected from the illuminated structure. In an embodiment, the detecting comprises measuring the phase of radiation reflected from the illuminated structure.

In an embodiment, there is provided an inspection apparatus for determining edge placement error of a substrate produced using a lithographic process, the inspection apparatus comprising: an illumination system configured to illuminate with radiation a first structure produced using the lithographic process, the first structure comprising first and second layers, each of the layers having first areas of electrically conducting material and second areas of non-electrically conducting material; a detection system configured to detect scattered radiation arising from optical illumination of the first structure to obtain a first signal; and a processor configured to ascertain an edge placement error parameter on the basis of the first signal and a signal indicative of a first target relative position which is a target position of edges between the first areas and the second areas of the first layer relative to edges between the first areas and the second areas of the second layer in the first structure during said lithographic process.

In an embodiment, the detection system is configured such that the first signal represents the intensity or phase of the scattered radiation and the processor is configured to (i) find that the first areas of electrically conducting material in different layers do not contact or that the first areas of electrically conducting material in different layers contact each other dependent upon whether the first signal is greater than or less than the value, and (ii) compare that finding with the first target relative position to ascertain the edge placement error parameter. In an embodiment, the detection system is further configured to detect scattered radiation arising from optical illumination of a second structure produced using the lithographic process and comprising first and second layers each having first areas of electrically conducting material and second areas of non-electrically conducting material, to obtain a second signal, and the processor is further configured to ascertain the edge placement error parameter additionally based on the second signal and a signal indicative of a second target relative position which is a target position of edges of the first areas of the first layer relative to edges of the first areas of the second layer in the second structure during said lithographic process. In an embodiment, the processor is configured to base the edge placement parameter at least partly on a comparison of the first and second signals. In an embodiment, the processor is configured to find, if a difference in magnitude between the first and second signals is greater than a predetermined value, that one structure of the first and second structures has first areas of electrically conducting material in different layers not contacting each other and that the other structure of the first and second structures has first areas of electrically conducting material in different layers contacting each other and compare that finding with the first target relative position and second target relative position to ascertain the edge placement error parameter. In an embodiment, the detection system is further configured to detect scattered radiation arising from optical illumination of at least one further structure produced using the lithographic process and comprising first and second layers, each of the layers having first areas of electrically conducting material and second areas of non-electrically conducting material to obtain at least one further signal, and the processor is additionally configured to base the edge placement error parameter on the at least one further signal and a signal indicative of at least one further target relative position which is a target position of edges of the first areas of the first layer relative to edges of the first areas of the second layer in the at least one further structure during said lithographic process. In an embodiment, the detection system is configured to detect scattered radiation arising from optical illumination of the first, second and further structures at the same time when they are in a row to create scattered radiation which combines to make a detection signal. In an embodiment, the detection system is configured to detect first and/or higher orders of scattered radiation. In an embodiment, the processor is configured to compare the first and/or higher order detection signal to a value and determine on that basis whether neither or one or both of the first and second sets have structures with first areas of electrically conducting material in different layers contacting each other and to use that determination to ascertain the edge placement error parameter. In an embodiment, the detection system is configured to illuminate the structure with a wavelength of between 400 and 700 nm, preferably of between 500 and 700 nm. In an embodiment, the detection system is configured to illuminate a plan dimension of between 5 µm×5 µm and 50 µm×50 µm, preferably between 10 µm×10 µm and 20 µm×20 µm.

In an embodiment, there is provided one or more patterning devices for determining edge placement error of a substrate produced using a lithographic process, one of the patterning devices comprising first a target pattern comprising: a first sub-pattern configured to produce a first layer of a first structure with a first layer pattern comprising first and second areas; and one of the patterning devices comprising a second target pattern comprising: a second sub-pattern configured to produce a second layer of the first structure with a second layer pattern comprising first and second areas, the second sub-pattern being positioned to have a first predetermined positional offset from a position relative to said first sub-pattern in which the first areas of the first and second sub-patterns just make contact.

In an embodiment, the first target pattern further comprises a third sub-pattern configured to produce a first layer of a second structure with a first layer pattern comprising first and second areas; and the second target pattern comprises a fourth sub-pattern configured to produce a second layer of the second structure with a second layer pattern comprising first and second areas, the fourth sub-pattern being positioned to have a second predetermined positional off-set from a position relative to said third sub-pattern in which the second areas of the third and fourth sub-patterns just touch each other, the first predetermined positional off-set being different from the second predetermined positional off-set. In an embodiment, the first predetermined positional off-set is such that the first areas of electrically conducting material in different layers of the first structure contact each other and the second predetermined positional off-set is such that the first areas of electrically conducting material in different layers of the second structure do not contact each other. In an embodiment, the first target pattern further comprises at least one first further sub-pattern configured to produce a first layer of a respective further structure with a first layer pattern comprising first and second areas; and the second target pattern comprises at least one second further sub-pattern configured to produce a second layer of the respective further structure with a second layer pattern comprising first and second areas, the at least one second further sub-pattern being positioned to have a further predetermined positional off-set from a position relative to said at least one first further sub-pattern in which the first areas of the first and second further sub-pattern just touch each other. In an embodiment, the first, third and first further sub-patterns are positioned adjacent each other in a row and the second, fourth and second further sub-patterns are positioned adjacent each other in said row. In an embodiment, the structures in said row alternate between a first set which all have the same predetermined positional off-set and a second set which have a equal predetermined positional off-set different from the first predetermined positional off-set. In an embodiment, the first and second layer patterns have a repetitive pattern. In an embodiment, features of the repetitive pattern have a pitch to produce features on the substrate with a pitch of the order of 5-100 nm, desirably 10-50 nm. In an embodiment, the first and second layer patterns of each structure have the same pattern and/or dimensions. In an embodiment, the first and second layer patterns comprise substantially parallel lines. In an embodiment, the first and second layer patterns have features with a critical dimension of the same order of magnitude as features of a device structure pattern on the respective patterning device. In an embodiment, features of the first and second layer patterns have a critical dimension in at least one direction to produce features on the substrate of between 2 and 50 nm, desirably between 2 and 20 nm. In an embodiment, the structure(s) has (have) a plan dimension to produce structures on the substrate of between 5 µm×5 µm and 50 µm×50 µm, preferably between 10 µm×10 µm and 20 µm×20 µm.

In an embodiment, there is provided a substrate for determining edge placement error of a lithographic process used to produce the substrate, the substrate comprising a target comprising a first structure, the first structure comprising at least two layers, each of the layers having first areas of electrically conducting material and second areas of non-electrically conducting material.

In an embodiment, there is provided a method of manufacturing devices wherein a device pattern is applied to a substrate using a lithographic process, the method including determining edge placement error of the substrate using a method as described herein. In an embodiment, the method further comprises controlling the lithographic process for later substrates in accordance with the result of the method of determining edge placement error.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
for a substrate comprising a first structure produced using a lithographic process, the first structure comprising first and second layers, each of the layers having first areas of electrically conducting material and second areas of non-electrically conducting material, obtaining a target signal indicative of a first target relative position which is indicative of a target position of edges between the first areas and the second areas of the first layer relative to edges between the first areas and second areas of the second layer in the first structure during the lithographic process, wherein the first areas of electrically conducting material in different layers come in or come out of contact with each other or the second areas of non-electrically conducting material in different layers come in or come out of contact with each other, dependent upon a position of edges between the first areas and the second areas of the first layer relative to edges between the first areas and second areas of the second layer in the first structure on the substrate;
detecting scattered radiation while illuminating the first structure with optical radiation to obtain a first signal; and
ascertaining an edge placement error parameter on the basis of the first signal and the first target relative position.

2. The method of claim 1, wherein the first signal represents the intensity or phase of the scattered radiation and the ascertaining step (i) finds that the second areas of non-electrically conducting material in different layers do or do not contact each other or that the first areas of electrically conducting material in different layers do or do not contact each other, dependent upon whether the first signal is greater than or less than a certain value, and (ii) compares that finding with the first target relative position to ascertain the edge placement error parameter.

3. The method of claim 1, wherein
the substrate further comprises a second structure produced using the lithographic process, the second structure comprising first and second layers each having first areas of electrically conducting material and second areas of non-electrically conducting material, and
the method further comprises detecting scattered radiation while illuminating the second structure with optical radiation to obtain a second signal,
wherein the edge placement error parameter is additionally based on the second signal and a second target relative position which is indicative of a target position of edges of the second areas of the first layer relative to edges of the second areas of the second layer in the second structure during the lithographic process.

4. The method of claim 3, wherein the ascertaining is at least partly based on a comparison of the first and second signals.

5. The method of claim 4, wherein the ascertaining finds, if a difference in magnitude between the first and second signals is greater than a certain value, that one structure of the first and second structures has second areas of non-electrically conducting material in different layers not contacting each other and that the other structure of the first and second structures has second areas of non-electrically conducting material in different layers contacting each other and compares that finding with the first target relative position and second target relative position to ascertain the edge placement error parameter.

6. The method of claim 3, wherein
the substrate further comprises at least one further structure produced using the lithographic process, each of the at least one further structures comprising first and second layers, each of the layers having first areas of electrically conducting material and second areas of non-electrically conducting material, and
the method further comprising detecting scattered radiation while illuminating the at least one further structure with optical radiation to obtain at least one further signal,
wherein the edge placement error parameter is additionally based on the at least one further signal and at least one further target relative position which is indicative of a target position of edges of the first areas of the first layer relative to edges of the first areas of the second layer in the at least one further structure during the lithographic process.

7. An inspection apparatus for determining edge placement error of a substrate produced using a lithographic process, the inspection apparatus comprising:
an illumination system configured to illuminate with radiation a first structure produced using the lithographic process, the first structure comprising first and second layers, each of the layers having first areas of electrically conducting material and second areas of non-electrically conducting material, wherein the first areas of electrically conducting material in different layers come in or come out of contact with each other or the second areas of non-electrically conducting material in different layers come in or come out of contact with each other, dependent upon a position of edges between the first areas and the second areas of the first layer relative to edges between the first areas and second areas of the second layer in the first structure on the substrate;
a detection system configured to detect scattered radiation arising from optical illumination of the first structure to obtain a first signal; and
a processor configured to ascertain an edge placement error parameter on the basis of the first signal and a signal indicative of a first target relative position which is a target position of edges between the first areas and the second areas of the first layer relative to edges between the first areas and the second areas of the second layer in the first structure during the lithographic process.

8. The inspection apparatus of claim 7, wherein the detection system is configured such that the first signal represents the intensity or phase of the scattered radiation and the processor is configured to (i) find that the second areas of non-electrically conducting material in different layers do or do not contact each other or that the first areas of electrically conducting material in different layers do or do not contact each other, dependent upon whether the first signal is greater than or less than a certain value, and (ii) compare that finding with the first target relative position to ascertain the edge placement error parameter.

9. The inspection apparatus of claim 7, wherein
the detection system is further configured to detect scattered radiation arising from optical illumination of a second structure produced using the lithographic process and comprising first and second layers each having first areas of electrically conducting material and second areas of non-electrically conducting material, to obtain a second signal, and
the processor is further configured to ascertain the edge placement error parameter additionally based on the second signal and a signal indicative of a second target relative position which is a target position of edges of the first areas of the first layer relative to edges of the first areas of the second layer in the second structure during the lithographic process.

10. The inspection apparatus of claim 9, wherein the processor is configured to base the edge placement parameter at least partly on a comparison of the first and second signals.

11. The inspection apparatus of claim 10, wherein the processor is configured to find, if a difference in magnitude between the first and second signals is greater than a certain value, that one structure of the first and second structures has first areas of electrically conducting material in different layers not contacting each other and that the other structure of the first and second structures has first areas of electrically conducting material in different layers contacting each other and compare that finding with the first target relative position and second target relative position to ascertain the edge placement error parameter.

12. The inspection apparatus of claim 9, wherein
the detection system is further configured to detect scattered radiation arising from optical illumination of at least one further structure produced using the lithographic process and comprising first and second layers, each of the layers having first areas of electrically conducting material and second areas of non-electrically conducting material to obtain at least one further signal, and the processor is additionally configured to base the edge placement error parameter on the at least one further signal and a signal indicative of at least one further target relative position which is a target position of edges of the first areas of the first layer relative to edges of the first areas of the second layer in the at least one further structure during the lithographic process.

13. The inspection apparatus of claim 12, wherein the detection system is configured to detect scattered radiation arising from optical illumination of the first, second and further structures at the same time when they are in a row to create scattered radiation which combines to make a detection signal.

14. The inspection apparatus of claim 13, wherein the detection system is configured to detect first and/or higher orders of scattered radiation.

15. The inspection apparatus of claim 14, wherein the processor is configured to compare the first and/or higher order detection signal to a value and determine on that basis whether neither or one or both of the first and second sets have structures with first areas of electrically conducting material in different layers contacting each other and to use that determination to ascertain the edge placement error parameter.

16. The inspection apparatus of claim 15, wherein the detection system is configured to illuminate the structure with a wavelength of between 400 and 700 nm.

17. The inspection apparatus of claim 7, wherein the detection system is configured to illuminate a plan dimension of between 5 µm ×5 µm and 50 µm×50 µm.

18. A method of manufacturing devices wherein a device pattern is applied to a substrate using a lithographic process, the method including determining edge placement error of the substrate using a method as claimed in claim 1.

19. A method comprising:
for a substrate comprising a first structure produced using a lithographic process, the first structure comprising first and second layers, each of the layers having first areas of electrically conducting material and second areas of non-electrically conducting material, obtaining a target signal indicative of a first target relative position which is indicative of a target position of edges between the first areas and the second areas of the first layer relative to edges between the first areas and second areas of the second layer in the first structure during the lithographic process, wherein a shift of at least one edge of the edges enables a change in electrical conduction of at least one first area of the first areas;

detecting scattered radiation while illuminating the first structure with optical radiation to obtain a first signal; and ascertaining an edge placement error parameter on the basis of the first signal and the first target relative position.

20. The method of claim 19, wherein the ascertaining (i) finds that the second areas of non-electrically conducting material in different layers do or do not contact each other or that the first areas of electrically conducting material in different layers do or do not contact each other, dependent upon whether the first signal is greater than or less than a certain value, and (ii) compares that finding with the first target relative position to ascertain the edge placement error parameter.

21. A non-transitory computer readable medium comprising instructions configured to cause a computer system to at least:
for a substrate comprising a first structure produced using a lithographic process, the first structure comprising first and second layers, each of the layers having first areas of electrically conducting material and second areas of non-electrically conducting material, obtain a target signal indicative of a first target relative position which is indicative of a target position of edges between the first areas and the second areas of the first layer relative to edges between the first areas and second areas of the second layer in the first structure during the lithographic process, wherein the first areas of electrically conducting material in different layers come in or come out of contact with each other or the second areas of non-electrically conducting material in different layers come in or come out of contact with each other, dependent upon a position of edges between the first areas and the second areas of the first layer relative to edges between the first areas and second areas of the second layer in the first structure on the substrate:

obtain a first signal corresponding to scattered radiation detected while illuminating the first structure with optical radiation; and ascertain an edge placement error parameter on the basis of the first signal and the first target relative position.

* * * * *